| United States Patent [19] | [11] Patent Number: 4,892,751 |
| Miyake et al. | [45] Date of Patent: Jan. 9, 1990 |

[54] METHOD OF AND APPARATUS FOR FORMING A THIN FILM

[75] Inventors: Kiyoshi Miyake, Tsukui; Akira Shintani, Koube; Keizo Suzuki, Kodaira; Takao Miyazaki, Hachioji, all of Japan

[73] Assignee: Hitachi, Ltd., Tokyo, Japan

[21] Appl. No.: 132,358

[22] Filed: Dec. 14, 1987

[30] Foreign Application Priority Data

Jan. 19, 1987 [JP] Japan .................................. 62-8027

[51] Int. Cl.$^4$ ............................................ B05D 1/08
[52] U.S. Cl. ..................................... 427/34; 427/38; 427/42; 427/53.1; 427/541
[58] Field of Search ................... 427/34, 38, 42, 53.1, 427/54.1; 219/121.36, 121.47, 121.6, 121.76, 121.78; 156/610, 613, 614

[56] References Cited

U.S. PATENT DOCUMENTS

| 4,579,750 | 4/1986 | Bowen et al. ...................... 427/53.1 |
| 4,629,859 | 12/1986 | Reddy ............................. 219/121.85 |
| 4,670,064 | 6/1987 | Schachameyer et al. ......... 427/53.1 |
| 4,685,976 | 8/1987 | Schachameyer et al. ......... 427/53.1 |

*Primary Examiner*—Stanley Silverman
*Attorney, Agent, or Firm*—Antonelli, Terry & Wands

[57] ABSTRACT

A method of forming a thin film wherein a gas which contains an element used to constitute a desired thin film as at least a part of its constituent elements or a condensed solid layer of this gas is irradiated with a high output power laser beam to dissociate the gas or the solid layer of the gas and thereby locally produce a plasma, and a substrate is irradiated with reactive particles produced in the plasma, thereby obtaining a highly-pure high-quality thin film. Also disclosed is an apparatus for realizing this method.

22 Claims, 7 Drawing Sheets

METHOD OF AND APPARATUS FOR FORMING A THIN FILM

BACKGROUND OF THE INVENTION

The present invention relates to a method of and apparatus for forming a thin film which is employed in a semiconductor device. More particularly, the present invention pertains to a method which is suitable for forming highly-pure thin films of semiconductors, insulators and metals. The present invention is also concerned with an apparatus which is effectively employed to carry out this method.

Plasma CVD (Chemical Vapor Deposition) has heretofore been known as a method of forming dense films of strong adhesion and employed to produce thin films of semiconductors, insulators or metals which are used to fabricate semiconductor devices, as described in Semiconductor Plasma Process Technology, edited and written by Takuo Sugano (Sangyo Tosho, Tokyo, July, 1980), pp. 178–193. However, in most plasma CVD processes, a direct current or an RF (Radio Frequency) discharge is utilized to generate a plasma. Therefore, the resulting plasma spreads over the whole interior of the vacuum chamber for plasma CVD. Accordingly, ions and radicals which are generated as a result of dissociation of a thin film forming gas in the plasma come into contact with electrodes to maintain a discharge or the vacuum chamber wall and react with the materials of these parts to generate impurity elements from the electrodes and the vacuum chamber wall. The resulting impurity elements are transported through the plasma and deposited in the produced thin film as a polluting element, thus causing the quality of the produced thin film to be degraded.

There is another method of forming a thin film wherein a solid material such as germanium or silicon is irradiated with a strong laser beam to rapidly melt, for example, the silicon surface, thereby producing a plasma, and a substrate is irradiated with silicon particles generated in the plasma to thereby form a thin film on the substrate. This method is described in Journal of Vacuum Science and Technology, B3(4) (1985), pp. 968–974, D. Lubben S. A. Barnett, K. Suzuki, S. Gorbatkin and J. I. Greene. According to this prior art method, it is possible to rapidly melt only the solid silicon and produce a plasma by irradiation with a strong laser beam, and therefore it is easy to form a highly-pure thin film having a reduced impurity content. This conventional method suffers, however, from the problem that the silicon which is suddenly melted bumps easily, which results in many silicon fine particles flying into the vacuum from the surface in the form of powder. Since no consideration has heretofore been given to prevention of generation of these fine particles, it has been possible to produce only a silicon thin film containing fine particles having a size of 0.5 to 2.5 $\mu$m at a density of $10^5$ to $10^6$ particles/cm$^2$.

Thus, the above-described prior arts have the following problems. Namely, in the former prior art, no satisfactory consideration is given to the plasma producing method for forming a highly-pure thin film having a reduced impurity content. As a result, part of the material of the electrodes or the vacuum chamber, which are used to generate a plasma, is deposited in the produced thin film as a polluting element. In the case of the latter prior art method, employment of a plasma producing method by means of a laser beam eliminates the need for electrodes, and since the interaction between the vacuum chamber wall and a plasma produced by a laser is reduced, there has been an improvement in producing a thin film of higher purity than in the case of the former prior art method. However, no satisfactory consideration has been given to the method of preventing the generation of fine particles during the production of a thin film. Accordingly, it is impossible to produce a highly-pure thin film containing no fine particles by the latter prior art method.

SUMMARY OF THE INVENTION

It is a primary object of the present invention to provide a method of an apparatus for forming highly-pure thin film. The above-described object is attained by a method wherein a highly-pure gas to form a thin film which gas contains as a constituent element an element for forming the thin film, or a solid layer of this gas, is dissociated by means of a strong laser beam to thereby produce a plasma, and a substrate is irradiated with the locally produced plasma. It has already been known for long that a gas or a solid material causes insulator breakdown in the presence of an electric field produced by a strong laser beam which has an electric field intensity of $10^6$ to $10^7$ V/cm, thus producing a plasma. In particular, a method wherein a high temperature and high density plasma is produced by dissociating hydrogen gas with a strong laser beam to cause a nuclear fusion reaction is known as a nuclear fusion method with a laser. The method wherein a plasma is produced by a laser beam advantageously enables a high-density gas plasma to be locally produced only in a region where the electric field intensity is increased spatially.

In a plasma produced by a laser, dissociation and ionization of the gas take place intensely. Accordingly, if a feed gas containing an element for forming a thin film or the solid layer of this gas is dissociated to produce a plasma by the plasma producing method by a laser, it is possible to produce various kinds of particles as an intermediate product which is suitably employed to produce a thin film. These particles as an intermediate product are sufficiently chemically reactive to produce a desired thin film, so that, when the particles reach the surface of a substrate on which a thin film is to be deposited, they cause promptly a chemical reaction to produce a desired thin film on the surface of the substrate.

In the case of the nuclear fusion by a laser, the plasma produced by the laser may be considered to be an energy source for causing a nuclear fusion reaction, whereas, in the present invention, a plasma produced by a laser is employed for generation of chemically reactive particles required to produce a desired thin film. In this point, the present invention differs from the prior art.

The method wherein a plasma is produced by the electric field of a laser beam as in the case of the present invention has no need to use electrodes such as those in the conventional plasma CVD process nor the disadvantage that the produced plasma spreads over the whole interior of the vacuum chamber. There is therefore no fear that impurity elements generated from the electrodes or the vacuum chamber wall might be deposited in the produced thin film as a polluting element.

Since in the present invention a gas is dissociated to produce a plasma, no solid material is melted. There is therefore no fear of fine particles being generated due to a bump phenomenon. Accordingly, it is advantageously possible to produce a highly-pure and uniform thin film which contains no foreign matter such as fine particles.

A condensed solid layer of a gas is formed from gas molecules which are connected together by Van der Waals force of relatively weak bond strength rather than by strong chemical bonds. Therefore, when the solid layer of a gas is irradiated with a laser beam to produce a plasma, even if the condensed solid layer is partially vaporized or evaporated as a result of a sudden rise in temperature, no fine particles which are connected together by strong chemical bonds are generated. Even if a cluster-like condensed solid collides against the substrate, since the bond strength is relatively weak, the solid is dissociated on the surface of the substrate and there is therefore no adverse effect on the produced thin film.

DESCRIPTION OF THE PREFERRED EMBODIMENTS

Embodiments of the present invention will be described hereinunder with reference to the accompanying drawings.

[Embodiment 1]

Figure 1:
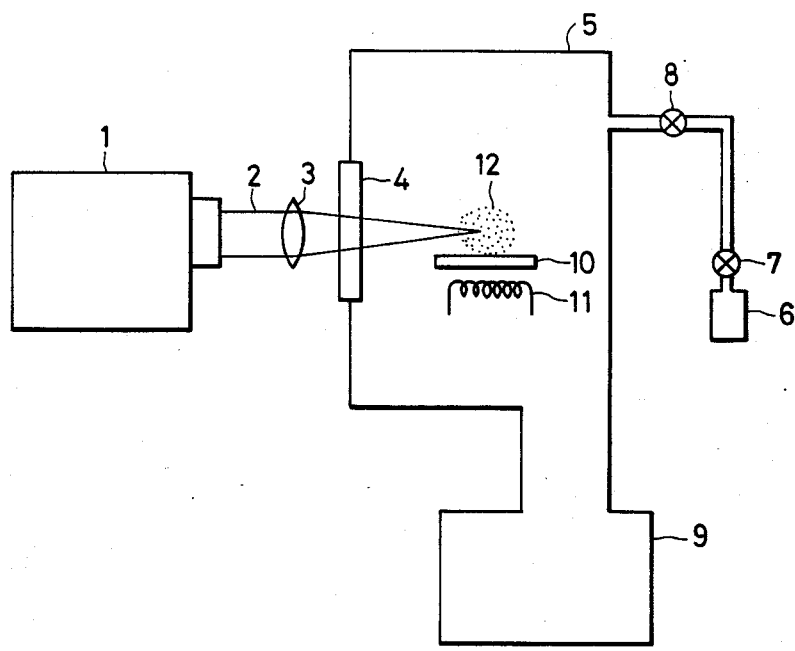
FIG. 1 schematically shows a thin-film forming apparatus in accordance with one embodiment of the present invention.

FIG. 1 shows an apparatus for forming a Ge thin film in accordance with the method of the present invention using a $GeH_4$ gas as a feed gas. In this embodiment, a laser beam having a wavelength of 248 nm was oscillated by a pulse generated high-output KrF excimer laser 1 and led to enter a vacuum chamber 5 through a focusing optics consisting of a convex lens 3 made of fused quartz and having a focal length of 500 mm and further through a window 4 made of fused quartz. The KrF excimer laser beam 2 had a rectangular cross-sectional feature and a cross-sectional area of 10 mm × 30 mm. The pulse period was 10 nsec and the laser energy was 300 mJ/pulse. The repetition frequency of laser pulse was 50 Hz. The laser beam 2 was focused by the convex lens 3 so that the cross-sectional area of the focused laser beam 2 was 0.1 mm × 0.3 mm at the central position in the vacuum chamber 5.

At the same time, a $GeH_4$ gas was introduced into the vacuum chamber 5 from a gas cylinder 6 through a pressure reducing valve 7 and a gas flow adjusting valve 8. The vacuum chamber 5 was evacuated by an evacuation pump 9 and the flow rate of the $GeH_4$ gas was set at 50 sccm, whereby the pressure inside the vacuum chamber 5 was set at 1 Torr.

A substrate 10 on which a desired Ge thin film was to be deposited was a Si wafer having a diameter of 4 inches and a thickness of 0.4 mm. The substrate 10 was placed so that its plane was parallel to the optical path of the laser beam 2. The position of the substrate 10 was 1 cm away from the central position in the vacuum chamber 5 where the laser beam 2 was focused. A substrate heating heater 11 was provided at the back of the substrate 10 to maintain the temperature of the substrate 10 at 400° C.

Figure 2:
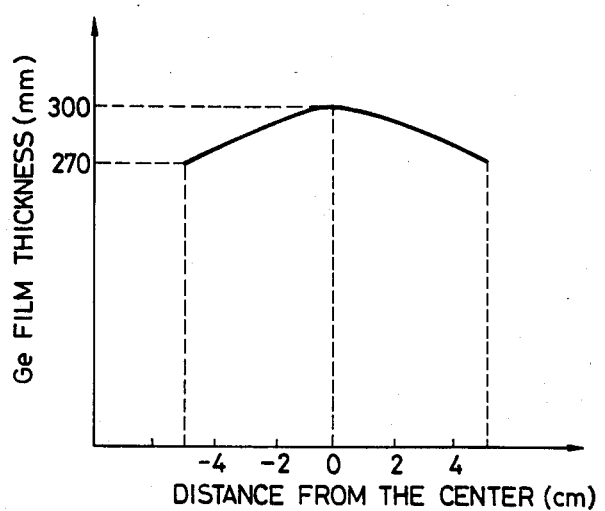
FIG. 2 is a characteristic chart exemplarily showing the thicknesses of a thin film produced by the apparatus shown in FIG. 1.

With the above-described arrangement, when the laser beam 2 from the KrF excimer laser 1 was applied to the inside of the vacuum chamber 5, intense red emission from a red plasma 12 was observed only within the central region in the vacuum chamber 5. This shows that $GeH_4$ is dissociated to produce hydrogen in the laser plasma of the $GeH_4$. With the temperature of the substrate 10 maintained at 400° C., irradiation with the laser beam 2 was carried out for 5 minutes, As a result, it was possible to produce a Ge thin film having a thickness of 300 nm in the central portion of the substrate 10. FIG. 2 shows the film thickness distribution of the produced Ge thin film over the Si wafer 10 having a diameter of 4 inches. As will be clear from FIG. 2, the uniformity of the thin film was within ±10% over the wafer 10.

When the produced Ge thin film was measured by SIMS (Secondary Ion Mass Spectrometer) in order to detect whether or not any impurity element was present in the film, isotope elements of Ge alone were observed but no elements other than Ge were detected, that is, the produced Ge thin film contained no light element impurities such as C or O nor heavy metal impurities such as Fe, Ni or Cr. Thus, it was found that the impurity content in the Ge thin film was lower than the measurable minimum limit of SIMS.

Although in the above-described embodiment the Ge thin film was produced using the laser plasma of $GeH_4$ gas, it is possible to employ any type of feed gas which contains as a constituent element Ge which is an element employed to constitute a desired thin film. The method of the present invention may also be applied to production of thin films of semiconductors and metals in addition to Ge by changing the kind of the feed gas employed.

[Embodiment 2]

Figure 3:
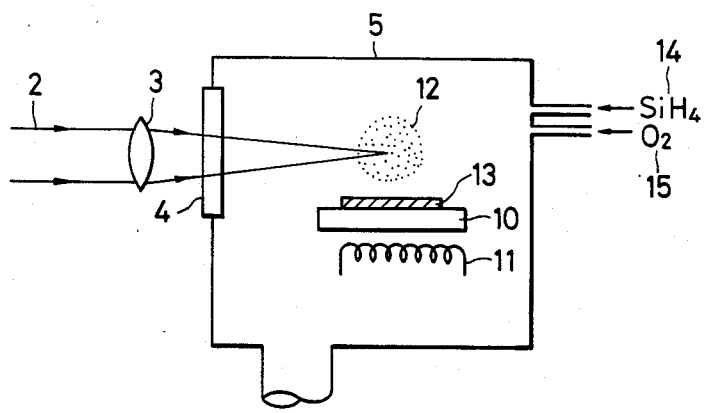
FIG. 3 schematically shows a thin-film forming apparatus in accordance with another embodiment of the present invention.

FIG. 3 shows an apparatus for producing a $SiO_2$ thin film by dissociating two different kinds of feed gas, i.e., $SiH_4$ gas 4 and $O_2$ gas 15, in accordance with the present invention. In the same manner as in the first embodiment, $SiH_4$ gas and $O_2$ gas were introduced into the evacuated vacuum chamber 5 at respective flow rates of 50 sccm and −100 sccm, and the pressure inside the vacuum chamber 5 was set at 3 Torr. As the substrate 10, a GaAs single crystal substrate was employed, an the temperature of the substrate 10 was maintained at 200° C. by the substrate heating heater 11. A KrF laser beam 2 having a wavelength of 248 nm was focused by a convex lens 3 made of fused quartz so that the laser beam 2 was passed through a quartz window 4 and focused at a position 10 mm away from the surface of the substrate 10, thereby dissociating the mixed gas of the $SiH_4$ and $O_2$ gases introduced into the vacuum chamber 5, and thus producing a plasma 12. The laser energy per pulse was 300 mJ. The pulse period was 10 nsec, and the repetition frequency of laser pulse was 10 Hz. Under these conditions, the irradiation with the laser beam 2 was carried out for 5 minutes.

As a result, a $SiO_2$ film 13 having a film thickness of 2000 Å was deposited on the surface of the GaAs substrate 10.

Figure 4:
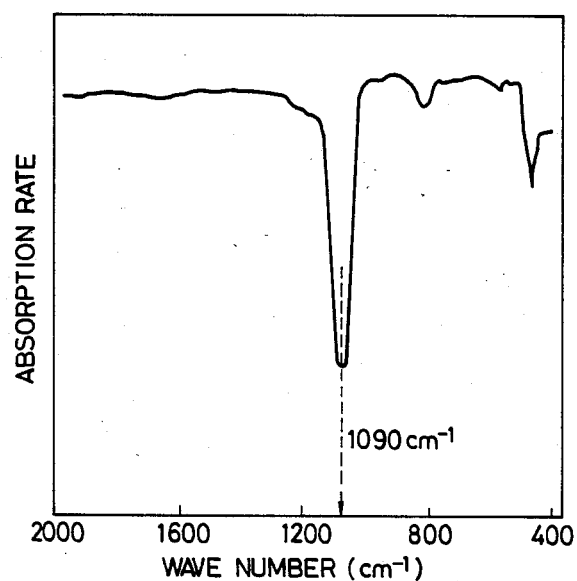
FIG. 4 is a chart showing the IR (Infrared) absorption spectrum of the $SiO_2$ film obtained by the apparatus shown in FIG. 3.

FIG. 4 shows the infrared absorption spectrum of the obtained $SiO_2$ film. The peak which represents the absorption of Si—O is found at a wave number of 1090 $cm^{-1}$, but there is substantially no peak which is attributed to bonds, e.g., Si—H. Accordingly, the produced film was considered to be the desired $SiO_2$ film.

Although in this embodiment two different kinds of feed gas, i.e., $SiH_4$ gas and $O_2$ gas, were employed, it is also possible to produce a thin film of a compound or alloy having a complicated composition by carrying out the method of the present invention using a plurality of different kinds of feed gas each containing at least one element which is used to constitute a desired thin film.

[Embodiment 3]

Figure 5:
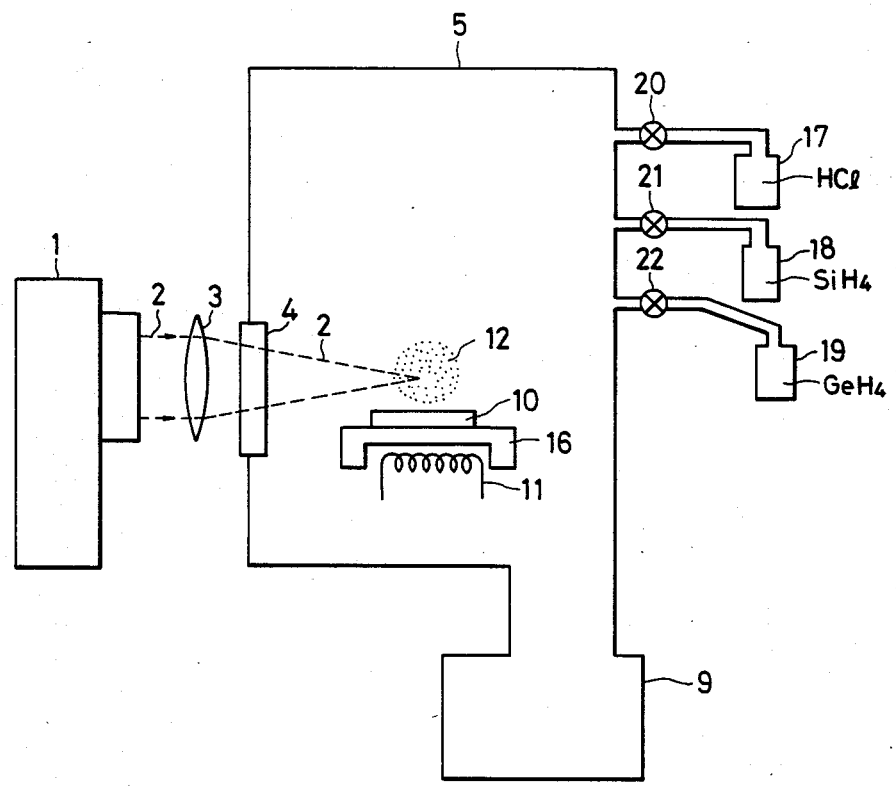
FIG. 5 schematically shows a thin-film forming apparatus in accordance with still another embodiment of the present invention.

FIG. 5 shows an apparatus for producing a thin film made of single crystal layers of Si and Ge on a single crystal Si substrate in accordance with the method of the present invention.

The vacuum chamber 5 was evacuated by the evacuation pump 9 to an ultra high vacuum of $1 \times 10^{-10}$ Torr or less, and a single crystal Si (100) substrate 10 was placed on a substrate holder 16 disposed within the vacuum chamber 5. The substrate temperature was maintained at 600° C. by the substrate heating heater 11.

Three different kinds of feed gas, i.e., HCl gas 17, $SiH_4$ gas 18 and $GeH_4$ gas 19, were introduced in a pulse controlled manner into the vacuum chamber 5 from three gas feeding lines through pulse controlled gas feeding valves 20, 21 and 22, respectively.

A laser beam 2 having a wavelength of 248 nm and a pulse period of 10 nsec was oscillated by a KrF excimer laser 1 having an output of 300 mJ/pulse. The laser beam 2 was focused by a quartz convex lens 3 having a focal length of 500 mm and led to enter the vacuum chamber 5 through a quartz window 4 so that the focused laser beam 2 had a cross-sectional area of 0.1 mm×0.3 mm at the position 10 mm away from the surface of the Si substrate 10.

Figure 6:
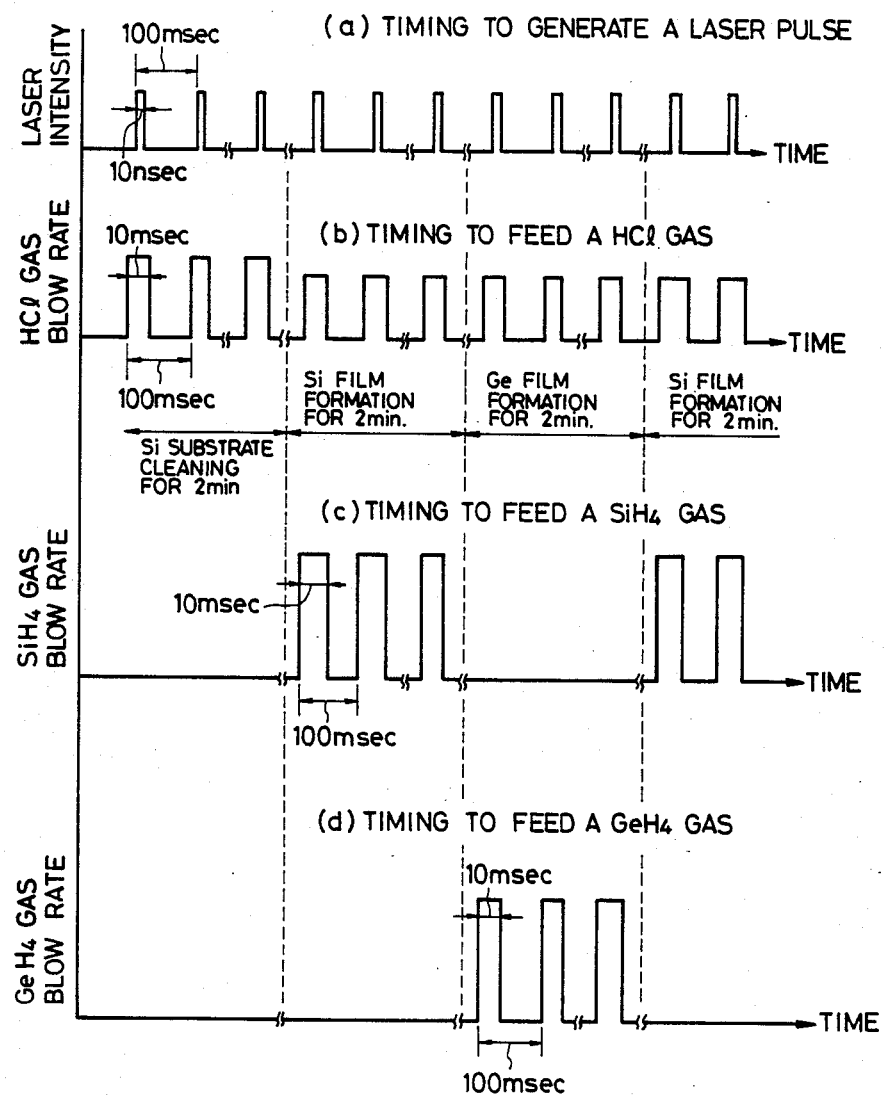
FIG. 6 is a chart showing the operation of the apparatus shown in FIG. 5.

Conditions for irradiation with the laser beam 2 and conditions for gas feed were such as those shown in FIG. 6. More specifically, the feed of the gases was effected in synchronism with the irradiation with the laser beam 2 having a repetition frequency of 10 Hz and a pulse period of 10 nsec as follows. For first two minutes, the pulse controlled HCl gas feeding valve 20 was ON/OFF controlled in response to pulses having a pulse period of 10 msec and a repetition frequency of 10 Hz to clean the surface of the Si substrate 10.

The pulse controlled feed of HCl gas caused the pressure inside the vacuum chamber 5 to rise momentarily to $5 \times 10^{-8}$ Torr from $1 \times 10^{-10}$ Torr. However, when 40 msec had elapsed after the valve 20 had been closed, the degree of vacuum lowered to $1 \times 10^{-8}$ Torr.

After the surface of the Si substrate 10 contaminated by a plasma 12 produced by a laser had been cleaned with the HCl gas for 2 minutes, the pulse controlled HCl gas feeding valve 20 and the pulse controlled $SiH_4$ gas feeding valve 21 were simultaneously ON/OFF controlled for 2 minutes at a repetition frequency of 10 Hz in synchronism with the laser pulses, as shown in FIG. 6. The amounts of HCl gas 17 and $SiH_4$ gas 18 which were fed per pulse at this time were 0.5 scc and 1 scc, respectively. As a result of the 2-minute irradiation with the plasma 12 produced by a laser from the $SiH_4$+HCl mixed gas, a single crystal Si thin film having a thickness of 20 Å was deposited on the surface of the substrate 10.

Next, with the pulse controlled $SiH_4$ gas feeding valve 18 closed, the pulse controlled $GeH_4$ and HCl gas feeding valves 19 and 17 were simultaneously ON/OFF controlled for following two minutes at a repetition frequency of 10 Hz as shown in FIG. 6, thereby irradiating the Si substrate 10 with a plasma 12 produced by a laser from the $GeH_4$+HCl mixed gas. The amounts of HCl and $GeH_4$ gases which were fed per pulse at this time were 0.5 cc/pulse and 1 cc/pulse, respectively, when measured with atmospheric pressure unit. As a result of the 2-minute irradiation with the plasma 12 produced by a laser from the $GeH_4$+HCl mixed gas, a single crystal Ge thin film having a thickness of 20 Å was formed on the single crystal Si thin film produced previously.

Figure 7:
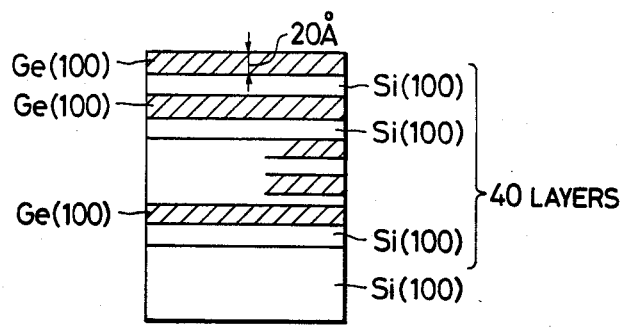
FIG. 7 shows films obtained by the apparatus shown in FIG. 5.

The irradiation with the plasma produced from the $SiH_4$+HCl mixed gas and the irradiation with the plasma produced from the $GeH_4$+HCl mixed gas were alternately repeated 20 times. As a result, it was possible to obtain a thin film having a multilayer construction made of single crystal layers, i.e., a multilayer construction made of alternating Ge and Si layers, on the Si (100) single crystal substrate, as shown in FIG. 7. In the multilayer construction, each layer had a thickness of 20 Å and the overall film thickness was 800 Å.

Thus, in this embodiment, relatively large amounts of gases are fed for a short period of time during which the laser beam is applied by the use of pulse controlled valves, thereby producing a plasma to form a thin film. Accordingly, it is advantageously possible to reduce the size and production cost of the evacuation pump employed to maintain the inside of the vacuum chamber at an ultra high vacuum at all times.

In addition, since it is possible to temporally effect precise control of the kinds and amounts of gases to be fed, it is possible to considerably facilitate the gas feed control operation which is required when the film quality or structure are desired to be changed in the direction of thickness of a film to be formed or when a thin film having a multilayer construction is to be produced or when a very small amount of impurity element is desired to be doped.

[Embodiment 4]

Figure 8:
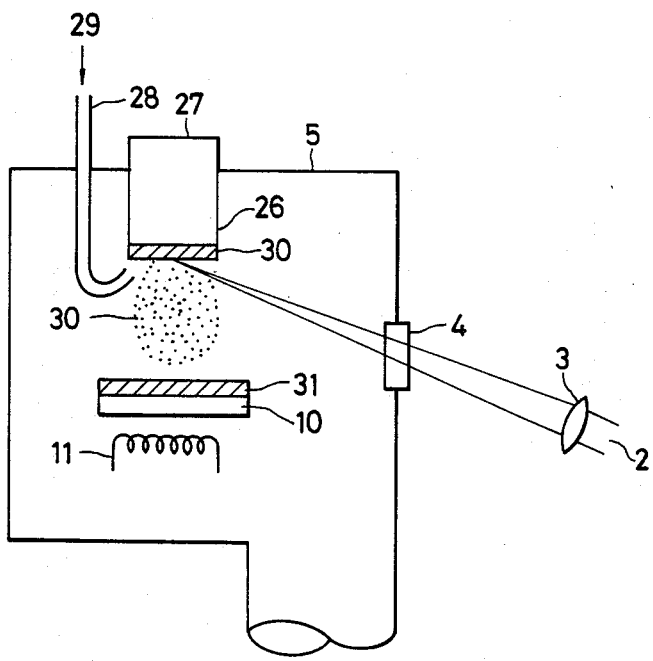
FIGS. 8 and 9 are schematic views respectively showing thin-film forming apparatuses in accordance with further embodiments of the present invention.

FIG. 8 shows an apparatus for forming a Ge thin film in accordance with the method of the present invention using as a feed gas a $GeH_4$ gas diluted with $H_2$ gas to 10%. In this embodiment, a laser beam having a wavelength of 248 nm was oscillated by a pulse generated high-output KrF excimer laser and led to enter a vacuum chamber 5 through a focusing optics consisting of a convex lens 3 made of fused quartz and having a focal length of 500 mm and further through a window 4 made of fused quartz, thereby applying the laser beam 2 to the surface of a cryogenic head 26. The KrF excimer laser beam 2 had a rectangular cross-sectional feature and a cross-sectional area of 10 mm×30 mm. The pulse period was 10 nsec and the laser energy was 300 mJ/pulse. The repetition frequency of laser pulse was 50 Hz. The laser beam 2 was focused by the convex lens 3 so that the cross-sectional area of the focused laser beam 2 was 0.1 mm×0.3 mm at the center of the cryogenic head 26.

At the same time, the cryogenic head 26 was cooled down to $-165°$ C. by a cryogenic means 27 installed within the vacuum chamber 5. A GeH$_4$ gas 26 diluted with H$_2$ gas to 10% was introduced into the vacuum chamber 5 through a gas feeding aperture 28 provided in the wall of the vacuum chamber 5 and the gas was blown against the surface of the cryogenic head 26 to thereby produce a solid layer 30 of GeH$_4$ gas having a thickness of 2 mm.

A substrate 10 on which a desired Ge thin film was to be deposited was a Si wafer having a diameter of 4 inches and a thickness of 0.4 mm. The substrate 10 was disposed at a position 2 cm away from the surface of the cryogenic head 26 which was to be irradiated with the laser beam 2, as shown in FIG. 8. The pressure inside the vacuum chamber 10 at the time when the laser beam 2 was applied was $1\times10^{-7}$ Torr. A substrate heating heater 11 was provided at the back of the substrate 10 to maintain the temperature of the substrate 10 at 400° C.

With the above-described arrangement, the KrF excimer laser beam 2 was applied to the central portion of the solid layer 30 of GeH$_4$ gas formed on the cryogenic head 26. At this time, intense red emission from a plasma was observed in a region between the cryogenic head 26 and the substrate 10. This emission was from the plasma 30 produced by the action of the laser beam 2, and this fact shows that GeH$_4$ is dissociated to produce hydrogen in the laser plasma of the GeH$_4$. With the temperature of the substrate 10 maintained at 400° C., irradiation with the laser beam 2 was carried out for 1 minute. As a result, it was possible to produce a Ge thin film 31 having a thickness of 300 nm on the substrate 10.

When the produced Ge thin film was measured by SIMS (Secondary Ion Mass Spectrometer) in order to detect whether or not any impurity element was present in the film, isotope elements of Ge alone were observed but no elements other than Ge were detected, that is, the produced Ge thin film contained no light element impurities such as C or O nor heavy metal impurities such as Fe, Ni or Cr. Thus, it was found that the impurity content in the Ge thin film was lower than the measurable minimum limit of SIMS.

Although in the above-described embodiment the Ge thin film was produced by dissociating the solid layer of GeH$_4$ gas and thereby producing a plasma, it is possible to emply any type of feed gas which contains as a constituent element Ge which is an element employed to constitute a desired thin film. The method of the present invention may also be applied to production of thin films of semiconductors and metals in addition to Ge by changing the kind of the feed gas employed.

[Embodiment 5]

Figure 9:
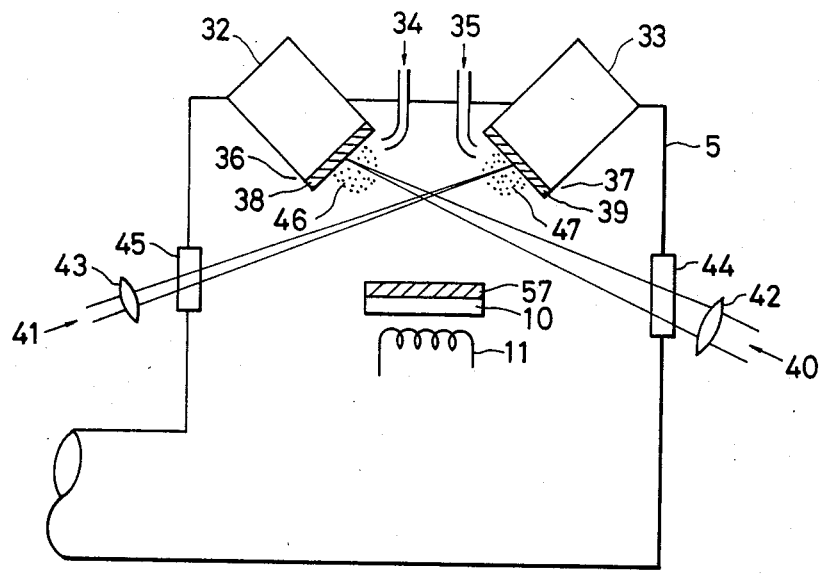

FIG. 9 shows an apparatus for producing a thin film made of single crystal layers of Si and Ge on a single crystal Si substrate in accordance with the method of the present invention.

The vacuum chamber 5 was evacuated to an ultra high vacuum of $1\times10^{-10}$ Torr or less, and a single crystal Si (100) substrate 10 was disposed within the vacuum chamber 5. The substrate temperature was maintained at 600° C. by the substrate heating heater 11.

Two cryogenic means 32 and 33 were installed within the vacuum chamber 5, and GeH$_4$ gas and SiH$_4$ gas were introduced from gas feeding apertures 34 and 35, respectively. The temperatures of cryogenic heads 36, 37 of the two cryogenic means 32, 33 were maintained at $-165°$ C. and $-185°$ C., respectively, which are the respective melting points of GeH$_4$ and SiH$_4$ gases. At this time, a GeH$_4$ gas solid layer 38 and a SiH$_4$ gas solid layer 39 each having a thickness of 1 mm or more were formed on the respective surfaces of the two cryogenic heads 36 and 37.

Two KrF excimer laser beams 40, 41 each having a wavelength of 248 nm and a laser output of 300 mJ/pulse were oscillated respectively from two KrF excimer lasers. The two laser beams 40, 41 were focused by respective convex lenses 42, 43 made of quartz and having a focal length of 500 mm and led to enter the vacuum chamber 5 through respective quartz windows 44, 45. The incident laser beams 40, 41 were focused within the GeH$_4$ gas solid layer 38 and the SiH$_4$ gas solid layer 39, respectively, with a cross-sectional area of 0.1 mm×0.3 mm.

Figure 10:
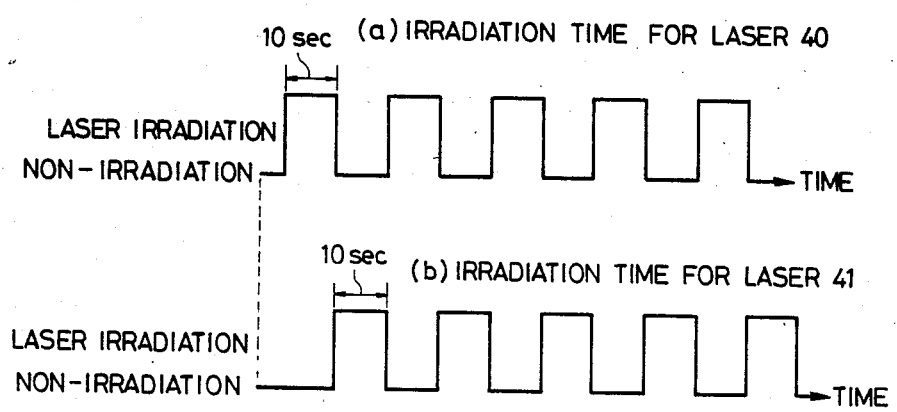
FIG. 10 is a chart showing the operation of the apparatus shown in FIG. 9.

FIG. 10 shows the timing at which the two laser beams 40 and 41 were applied to irradiate the respective targets. As shown in the figure, the laser beams 40, 41 emitted from KrF excimer lasers working with 10 Hz repetition frequency were alternately applied to the GeH$_4$ gas solid layer 38 and the SiH$_4$ gas solid layer 39 fifty times at an interval of 10 seconds. During the irradiation with the laser beams 40, 41, emission from the plasmas 46, 47 produced by lasers was observed at the front of the cryogenic heads 47, 48.

Figure 11:
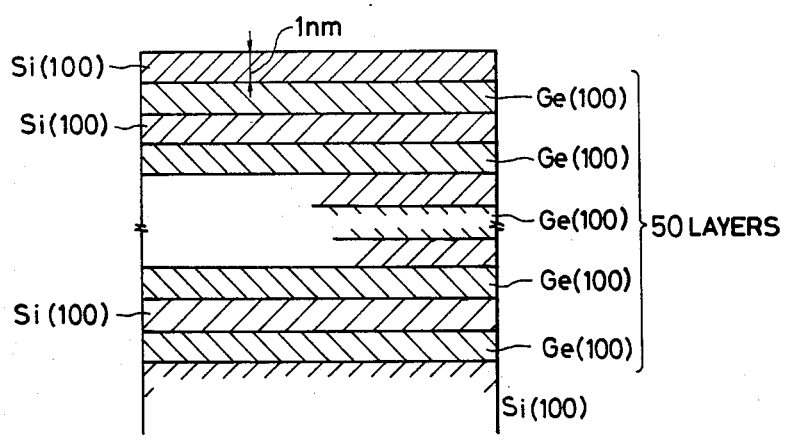
FIG. 11 shows films obtained by the apparatus shown in FIG. 9.

As a result of the irradiation with the plasmas 46, 47 produced by lasers, a single crystal epitaxial multilayer thin film 57 made of alternating 50 layers of Si and Ge each having a thickness of 2 nm was produced on the Si (100) substrate, as shown in FIG. 11.

Although in this embodiment a multilayer thin film consisting of two different kinds of film, i.e., Ge and Si films, alternately laid one upon another was exemplarily formed, the method of the present invention may also be applied to production of thin films having further complicated structures. More specifically, it is possible to design multilayer thin film structures having any kind of structure in the depthwise direction by adopting the method wherein a plurality of different kinds of gas are solidified and adsorbed on the respective surface of a plurality of cryogenic heads and then irradiated with respective laser beams to produce plasmas and by previously setting and controlling the order in which the laser beams are to be applied, together with the irradiation frequency, the laser beam intensity, etc. According to the present invention, even when the gas solid layer on a cryogenic head is not irradiated with the pulse controlled laser beam, GeH$_4$ or SiH$_4$ gas is continuously blown against this cryogenic head and the feed gas is therefore continuously supplied. In addition, since the greater part of the blown feed gas is adsorbed on the surface of the cryogenic head, there is no increase in the back pressure inside the vacuum chamber. Thus, this embodiment has these two great advantages.

[Embodiment 6]

Figure 12:
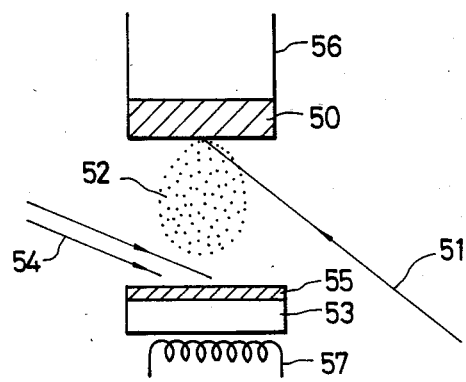
FIG. 12 schematically shows a thin-film forming apparatus in accordance with a still further embodiment of the present invention.

FIG. 12 shows an apparatus for forming a diamond-like carbon film 55 by irradiating a condensed solid layer 50 of ethylene gas with a focused ruby laser 51 having a wavelength of 694 3 nm to produce a plasma 52 and irradiating the surface of a substrate 53 with a $CO_2$ laser beam 54 having a wavelength of 10.6 μm while the substrate 53 was being irradiated with the plasma 52. The solid layer 50 of ethylene gas was formed by cooling down a cryogenic head 56 to −180° C. which is lower than the melting point of ethylene gas, i.e., −169.5° C. The thickness of the solid layer 50 was 5 mm. The ruby laser beam 51 was focused within the solid layer 50 so that the beam diameter was 0.1 mm. The laser beam 51 had a pulse period of 20 nsec, a peak output of 10 MW and a repetition frequency of 10 Hz. The substrate 53 was an aluminum substrate having a magnetic thin film coated on its surface to a thickness of 1.0 μm. The substrate temperature was maintained at 100° C. by means of a heater 57.

The plasma 52 produced by irradiation with the ruby laser beam 51 reached the substrate 53 after a flight time of 10 μsec on the average, and therefore, in synchronism with the generation of the plasma 52, the surface of the substrate 53 was irradiated with the $CO_2$ laser beam 54 in order to heat the substrate surface. The intensity of the $CO_2$ laser beam 54 at the substrate surface was 0.1 J/cm². The surface of the substrate 53 was irradiated with the ruby laser beam 51 and the $CO_2$ laser beam 54 for 10 minutes at a repetition frequency of 10 Hz in accordance with the above-described method. As a result, a diamond-like thin film 55 was formed on the surface of the substrate 53, the film 55 showing a diffraction pattern of diamond when the film 55 was observed by electron beam diffraction. The thickness of the film 55 was 540 nm. The resulting diamond-like thin film had a thermal conductivity which was five times higher than that of copper, and the Vickers hardness of the produced thin film was high, i.e., 9.

Since in these embodiments a solidified gas is employed as a laser plasma source, it is possible to selectively form a solid layer of a desired gas only even in the case of a gas which is explosive, e.g., $SiH_4$ gas, and which is therefore usually used after being diluted with $H_2$ gas or the like, by maintaining the temperature of the cryogenic head at between the melting point of $SiH_4$ gas or lower, i.e., −185° C. or lower, and the melting point of $H_2$ gas or higher, i.e., −257° C. or higher. Since the density of the thus produced solid layer of $SiH_4$ gas is considerably higher than the density of $SiH_4$ gas simply diluted with $H_2$ gas, it is possible to produce a high-density plasma containing Si, and it is possible to realize high-rate film formation of Si. Further, the feed gas is selectively adsorbed and solidified on only the cooled cryogenic head and only a very small amount of gas is adsorbed on the vacuum chamber wall. Therefore, when the feed gas is corrosive, the rate at which the vacuum chamber wall is corroded is advantageously low.

In accordance with the foregoing embodiments, a plasma which is required to produce a desired thin film is produced by a laser beam in a vacuum chamber, and this plasma is brought into contact with the surface of a substrate, thereby enabling production of a high-quality thin film containing substantially no foreign matters such as impurity elements or fine particles.

By appropriately selecting a gas which is to be dissociated to produce a plasma and synchronizing the timing to feed the gas to the vacuum chamber with the laser beam irradiation time, it is possible to readily produce a multilayer film made of ultra thin films each having a thickness of 0.5 to 10 nm and also produce a thin film having a thickness of 10 nm or less.

Since the substrate is irradiated with particles which are in a plasma state, it is possible to produce various kinds of thin film from high-temperature insulator materials such as $SiO_2$ and $Si_3N_4$ or single crystal Si even if the substrate temperature is relatively low, i.e., from room temperature to 800° C., in the same manner as in the conventional plasma CVD.

The position where a plasma is to be produced by a laser can be changed as desired by adjusting the laser beam focusing optics. Therefore, if the position of the plasma produced by a laser is adjusted with respect to the position of the substrate, it is possible to produce a thin film with improved controllability for making uniform the quality of the produced thin film, e.g., the thickness and nature of the film, as compared with the thin films produced by the conventional plasma CVD.

Although a window is employed to introduce a laser beam into a vacuum chamber, there is no problem of the contamination of the window which has heretofore been experienced with the conventional plasma CVD since it is possible to eliminate the fear of a thin film being deposited on the surface of the window by disposing a plasma produced by a laser at a position which is spaced apart from the window. Accordingly, the efficiency in producing a thin film is improved, and the method of the present invention is most suitable for producing a thin film on the surface of a substrate having a relatively large area, i.e., a substrate having a diameter of 6 or 8 inches.

Although in the foregoing embodiments no means for irradiating a substrate with a plasma is specially provided, it is also possible to introduce either an electric or magnetic field between the plasma produced by a laser and the substrate in order to take out reactive particles from the plasma, thereby efficiently irradiating the substrate with a high-density plasma and thus producing a desired thin film at high speed.

As has been described above, the present invention provides a thin-film forming method wherein a gas which contains an element for constituting a thin film to be produced or a condensed solid layer of this gas is irradiated with a high output power laser beam to dissociate the gas and thereby locally produce a plasma, and a substrate is irradiated with reactive particles produced in the plasma to form a thin film on the surface of the substrate, together with an apparatus for realizing this method. Accordingly, it is possible to provide a method of and apparatus for forming a thin film which enable a highly-pure thin film to be produced.

What is claimed is:

1. A method of forming a thin film comprising the steps of:
   introducing a gas near a substrate, the gas containing an element used to constitute a predetermined thin film as part of its constituent elements;
   irradiating said gas with a high output power laser beam to locally produce a plasma by dissociating said gas; and
   forming a thin film on said substrate by the action of reactive particles produced in said plasma.

2. A method of forming a thin film according to claim 1, wherein said gas includes a gas which is reactive with the element constituting said thin film to form a reaction product having a relatively high vapor pressure to thereby etch said thin film.

3. A method of forming a thin film according to claim 1, wherein said gas contains elements used to constitute at least two different kinds of thin film, and the mixing ratio of said elements is changed temporally.

4. A method of forming a thin film according to claim 1, wherein the position where the plasma is generated is controlled by controlling the position of irradiation of said gas with said high output power laser beam.

5. A method of forming a thin film comprising the steps of:
disposing a condensed solid layer of a gas near a substrate, the gas containing an element used to constitute a desired thin film as at least a part of the constituent elements;
irradiating the condensed solid layer of said gas with a high output power laser beam to locally produce a plasma by dissociating said solid layer of said gas; and
forming a thin film on said substrate by the action of reactive particles produced in said plasma.

6. A method of forming a thin film according to claim 5, wherein said solid layer includes a plurality of solid layers formed by adsorbing and solidifying a plurality of different kinds of gas having different melting points on respective members maintained at surface temperatures corresponding to said melting points, each solid layer being irradiated with a laser independently of each other.

7. A method of forming a thin film according to claim 6, wherein the time at which each of said solid layers irradiated with a laser beam is controlled.

8. A method of forming a thin film according to claim 7, wherein said substrate is irradiated with ultraviolet rays simultaneously with the irradiation of said substrate with the plasma.

9. A method of forming a thin film according to claim 5, wherein the position where the plasma is generated is controlled by controlling the position of irradiation of said gas with said high output power laser beam.

10. A method of forming a thin film according to claim 1, wherein the substrate is positioned such that the substrate surface on which the film is formed is parallel to an optical path of the laser beam.

11. A method of forming a thin film according to claim 1, wherein said gas includes a plurality of different feed gases, each containing at least one element used to constitute said predetermined thin film.

12. A method of forming a thin film according to claim 18, wherein said predetermined thin film is made of a compound or alloy formed from elements of said plurality of different feed gases.

13. A method of forming a thin film according to claim 1, wherein the laser beam is a pulsed laser beam, said gas includes a plurality of gases fed sequentially, and the feeding of the plurality of gases is effected in synchronism with irradiation with the laser beam.

14. A method of forming a thin film according to claim 1, wherein, in forming said thin film, an electric or magnetic field is provided between said plasma and said substrate to take out reactive particles from the plasma to transfer the reactive particles to the substrate.

15. A method of forming a thin film according to claim 1, wherein the substrate is heated to a predetermined temperature during said forming a thin film.

16. A method of forming a thin film according to claim 1, wherein said reactive particles produced in said plasma include said element such that said thin film formed on said substrate includes said element as at least a part of the constituent elements thereof.

17. A method of forming a thin film according to claim 3, wherein said two different kinds of thin film are stacked one on the other so as to form a multilayer thin film.

18. A method of forming a thin film according to claim 5, wherein said condensed solid layer of a gas is disposed near said substrate by feeding said gas to a cryogenic head disposed near said substrate, the gas condensing on said cryogenic head.

19. A method of forming a thin film according to claim 6, wherein said plurality of solid layers are respectively irradiated with a laser, in sequence, so as to form a plurality of layers to provide a multilayer thin film structure.

20. A method of forming a thin film according to claim 5, wherein said gas is ethylene gas, the thin film being a carbon thin film.

21. A method of forming a thin film according to claim 20, wherein the laser beam is a laser beam from a $CO_2$ laser.

22. A method of forming a thin film according to claim 1, wherein said reactive particles produced in said plasma include said element such that said thin film formed on said substrate includes said element as at least a part of the constituent elements thereof.

* * * * *